(12) United States Patent
Sakurai et al.

(10) Patent No.: US 10,195,827 B2
(45) Date of Patent: Feb. 5, 2019

(54) FERROELECTRIC FILM AND METHOD OF PRODUCING SAME

(71) Applicant: MITSUBISHI MATERIALS CORPORATION, Tokyo (JP)

(72) Inventors: Hideaki Sakurai, Naka (JP); Jun Fujii, Naka (JP); Nobuyuki Soyama, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 249 days.

(21) Appl. No.: 15/080,728

(22) Filed: Mar. 25, 2016

(65) Prior Publication Data

US 2016/0279906 A1    Sep. 29, 2016

(30) Foreign Application Priority Data

Mar. 26, 2015  (JP) .................................. 2015-064152
Mar. 18, 2016  (JP) .................................. 2016-054836

(51) Int. Cl.
*B32B 18/00* (2006.01)
*H01G 4/12* (2006.01)
(Continued)

(52) U.S. Cl.
CPC ............ *B32B 18/00* (2013.01); *C04B 35/491* (2013.01); *C04B 35/62218* (2013.01); *C23C 18/1216* (2013.01); *C23C 18/1225* (2013.01); *C23C 18/1254* (2013.01); *H01G 4/1245* (2013.01); *H01L 41/1876* (2013.01); *H01L 41/318* (2013.01); *C04B 2235/3201* (2013.01); *C04B 2235/3203* (2013.01); *C04B 2235/3227* (2013.01); *C04B 2235/441* (2013.01);
(Continued)

(58) Field of Classification Search
None
See application file for complete search history.

(56) References Cited

U.S. PATENT DOCUMENTS 5,244,742 A * 9/1993 Ogi ..................... C23C 14/088
                                                            428/469
5,272,341 A   12/1993 Micheli et al.
(Continued)

FOREIGN PATENT DOCUMENTS

EP    0485907 A1    5/1992
JP    2956356 B2   10/1999

OTHER PUBLICATIONS

N. W. Schubring et al., "Graded Ferroelectrics: A New Class of Steady-State Thermal/Electrical/Mechanical Energy Interchange Devices," Integrated Ferroelectrics, Taylor & Francis, US, vol. 24, No. 1/04, 1999, pp. 155-168.
(Continued)

*Primary Examiner* — Lauren R Colgan
(74) *Attorney, Agent, or Firm* — Locke Lord LLP

(57) ABSTRACT

A ferroelectric film a plurality of fired films is provided. E each of the plurality of fired films is made of metal oxide in a perovskite structure including Pb, Zr, and Ti, a total content of Li, Na, and K in the each of the plurality of fired films is 3 mass ppm or less, and the total content of Li, Na, and K on one surface of each of the plurality of fired films is 5 times or more of the total concentration of Li, Na, and K on other surface of each of the plurality of fired films.

8 Claims, 2 Drawing Sheets

(51) Int. Cl.
  *C04B 35/491*   (2006.01)
  *C23C 18/12*   (2006.01)
  *H01L 41/187*   (2006.01)
  *H01L 41/318*   (2013.01)
  *C04B 35/622*   (2006.01)

(52) U.S. Cl.
  CPC ............ *C04B 2235/449* (2013.01); *C04B 2235/6562* (2013.01); *C04B 2235/72* (2013.01); *C04B 2235/75* (2013.01); *C04B 2235/768* (2013.01); *C04B 2237/346* (2013.01); *C04B 2237/704* (2013.01)

(56) References Cited

U.S. PATENT DOCUMENTS

| | | | |
|---|---|---|---|
| 8,137,525 B1 * | 3/2012 | Harreld | C25D 1/08 |
| | | | 205/159 |
| 2004/0178841 A1 | 9/2004 | Mantese et al. | |
| 2006/0043844 A1 | 3/2006 | Hammer-Altmann et al. | |
| 2006/0220780 A1 * | 10/2006 | Matsuoka | H01C 7/112 |
| | | | 338/21 |

OTHER PUBLICATIONS

Search Report dated Sep. 8, 2016, issued for the European patent application No. 16162247.7.

\* cited by examiner

FERROELECTRIC FILM AND METHOD OF PRODUCING SAME

TECHNICAL FIELD

The present invention relates to a ferroelectric film with improved service life reliability and a method of producing the ferroelectric film.

Priority is claimed on Japanese Patent Application No. 2015-064152, filed Mar. 26, 2015; and Japanese Patent Application No. 2016-054836, filed Mar. 18, 2016 the contents of which are incorporated herein by reference.

BACKGROUND ART

The PLZT film with a perovskite structure including Pb, La, Zr and Ti is used as a ferroelectric film, which is utilized for the infrared sensor; the piezoelectric filter; the oscillator; the laser modulator; the optical shutter; the capacitor film; the nonvolatile memory; and the like. For example, a PLZT film, in which the content of Li, Na, and K is reduced and the leakage current is suppressed, is disclosed in Patent Literature 1 (PTL 1).

CITATION LIST

Patent Literature

[PTL 1] Japanese Patent (Granted) Publication No. 2956356 (B)

SUMMARY OF INVENTION

Technical Problem

As described in PTL 1, the leakage current can be reduced by reducing the content of Li, Na and K. However, in terms of service life reliability, sufficient characteristics cannot be obtained occasionally.

The purpose of the present invention is to provide a ferroelectric film with improved service life reliability and a method of producing the ferroelectric film.

Solution to Problem

The first aspect of the present invention is a ferroelectric film made of a plurality of fired films, wherein each of the plurality of fired films is made of metal oxide in a perovskite structure including Pb, Zr, and Ti, a total content of Li, Na, and K in the each of the plurality of fired films is 3 mass ppm or less, and the total content of Li, Na, and K on one surface of each of the plurality of fired films is 5 times or more of the total concentration of Li, Na, and K on other surface of each of the plurality of fired films.

In the ferroelectric film of the first aspect of the present invention, a constant concentration gradient of the total content of Li, Na, and K may be formed in a film thickness direction between the one surface and the other surface in each of the plurality of fired films.

In addition, the other surface (the surface with the lower content of Li and the like) of first fired film may be adjacent to the one surface (the surface with the higher content of Li and the like) of a second fired film, the first fired film and the second fired films being each of a pair of adjacent fired films among the plurality of the fired films.

In addition, a total content of Li, Na, and K on the one surface of the second fired film may be 5 times or more of a total content of Li, Na, and K on the other surface of the first fired.

The second aspect of the present invention is a method of producing a ferroelectric film including the steps of applying a liquid composition for forming the ferroelectric film containing Pb, Zr and Ti on a substrate to form a precursor film at least once; calcining the precursor film in order to convert thereof to complex oxide to form a calcined film at least once; and firing the calcined film in order to crystallize thereof to form a fired film at least once, wherein the liquid composition for forming the ferroelectric film contains 3 mass % or more and 10 mass % or less of Li, Na and K as a total, and a wind speed of a carrier gas is 0.1 m/sec or more and 1.0 m/sec or less at a position 10 mm above from an upper surface of the substrate in the step of calcining.

The third aspect of the present invention is an electric part including the ferroelectric film according to the first aspect of the present invention.

Advantageous Effects of Invention

The ferroelectric film, which is the first aspect of the present invention, has excellent service life reliability, since the total content of Li, Na, and K in the each of the plurality of fired films is 3 mass ppm or less; and the total content of Li, Na, and K on one surface of each of the plurality of fired films is 5 times or more of the total concentration of Li, Na, and K on other surface of each of the plurality of fired films in ferroelectric film. In other cords, each of the fired films has a predetermined Li—Na—K content; and the Li—Na—K content changes drastically in the boundary between a fired film and an adjacent fired film to form a concentration gradient in the ferroelectric film configured as in the first aspect of the present invention. The drastic change of the content of Li and the like in the boundary of these fired films suppresses movement of oxygen defects in the film thickness direction; and contributes to improvement of service life reliability of the ferroelectric film.

According to the method of producing the ferroelectric film, which is the second aspect of the present invention, the Li—Na—K content forms a gradient while the predetermined content of Li and the like is retained, since the liquid composition for forming a ferroelectric film containing 3 mass % or more and 10 mass % or less of Li and the like as a total (hereinafter referred as "the liquid composition"); and the wind speed of a carrier gas is set to 0.1 m/sec or more and 1.0 m/sec or less at the position 10 mm above from an upper surface of the substrate in the step of calcining. Because of these, a ferroelectric film with excellent service life reliability can be obtained.

The electric part, which is the third aspect of the present invention, has the above-described ferroelectric film. Thus, it has excellent service life reliability.

DESCRIPTION OF EMBODIMENTS

Figure 1:
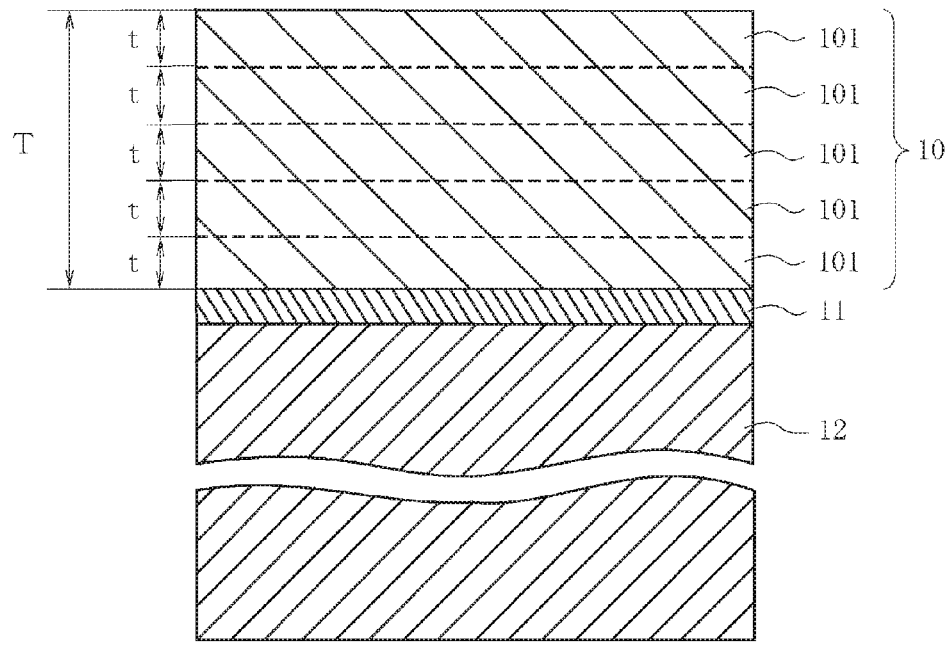
FIG. 1 is a schematic cross-sectional view of the ferroelectric film of at embodiment of the present invention.

Next, embodiments of the present invention are explained in reference to the drawing. However, the scope of the present invention is not particularly limited by the descriptions of these embodiments.

[Ferroelectric Film]

Figure 2:
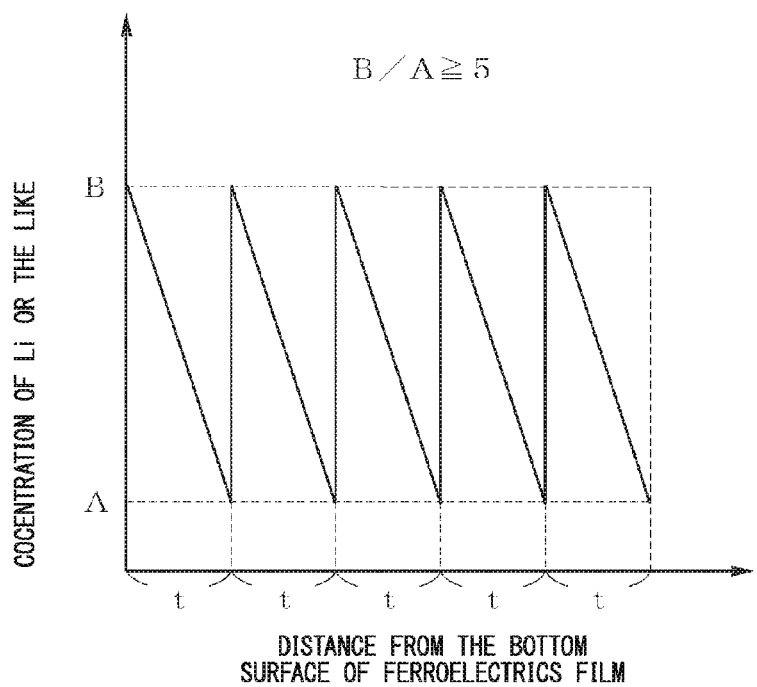
FIG. 2 is a graph showing concentration change of Li and the like in thickness direction of the ferroelectric film of an embodiment of the present invention.

The ferroelectric film 10 of the present embodiment is made of 5 layers of the fired films 101 formed on the lower electrode 11 provided to the substrate 12. The ferroelectric film 10 is made of metal oxide in a perovskite structure including Pb, Zr, and Ti. The total content of Li, Na, and K is 3 mass ppm or less. In addition, the total content of Li, Na, and K (hereinafter referred as "Li and the like") on one surface of each of the fired films 101 is 5 times or more of the total concentration of Li, Na and K on other surface of each of the fired films 101 as shown in FIG. 2. In addition to Pb, Zr, and Ti, La may be added to the ferroelectric film 10.

(1) Total Content of Li and the Like

Since the total content of Li and the like in the ferroelectric film 10 is set to 3 mass ppm or less, there is less segregation of impurities in grain boundaries in the film; and leakage current less likely to occur. Because of this, dielectric breakdown is less likely to occur, resulting in excellent service life reliability. If the total content of Li and the like were less than 0.3 mass ppm, it would be harder to obtain a suitable concentration gradient of Li or the like. Thus, it is preferable that the total content of Li and the like is set to 0.3 mass ppm or more, hi addition, if the total content of Li, Na, and K exceeded 3 as ppm, the leakage current would become excessive; and the service life of the ferroelectric film is shortened as a result. In addition, in each of the fired films, if the total content of Li and the like on one surface of the film were less than 5 times of the total content of Li and the like on other surface of the film, the concentration gradient of Li and the like in the film thickness direction of the fired would be moderate; and the extent of content change of Li and the like in the boundary of the fired films would be smaller. As a result, the function for suppressing the movement of oxygen defects becomes insufficient; and the service life of the ferroelectric film is shortened. It is preferable that the total content of Li and the like is set in the range between 0.5 mass ppm or more and 3 mass ppm or less. More preferably, it is set in the range between 1 mass ppm or more and 3 mass ppm or less.

(2) Concentration Gradient in the Fired Film with Li and the Like

In each of the fired films 101, there is sufficient concentration gradient of Li and the like in the thickness direction of the fired film, since the total content of Li and the like on one surface of each of fired films is five times or more of the total content of Li and the like on other surface of each of the fired films. Accordingly, the boundary of the fired films suppresses the movement of oxygen defects by the drastic change of the content of Li and the like in the boundary of the fired films. As a result, the ferroelectric film of the present embodiment has excellent service life reliability. In order to increase the concentration gradient of Li and the like, the total content of Li and the like has to be increased. However, due to the reason explained above, the total content of Li and the like has to be 3 mass ppm or less. Accordingly, preferable that the concentration gradient of Li and the like in the fired film is set to 12 times or less. It is preferable that the concentration gradient of Li and the like is set to 5 times or more and 10 times or less. Even more preferably, the concentration gradient of Li and the like is set to 5 times or more and 9 times or less.

It is preferable that this concentration gradient is a constant concentration gradient from the minimum value toward the maximum value. However, it can deviate about plus/minus 20% from the ideal constant concentration gradient (mass ppm/nm) locally, as long as the trend of the concentration change is kept in one direction (decreasing direction or increasing direction).

(3) Number of Layers of the Fired Films

It is preferable that the ferroelectric film 10 is made of 2 layers or more and 23 layers or less of the fired films 101. By laminating multiple fired films 101, the boundary is introduced in the ferroelectric film 10. This boundary acts as a trap suppressing the movement of oxygen defects to contribute lowered movement of oxygen defects. As a result, the service life reliability of the ferroelectric film 10 can be further improved. The reason for setting the number of fired film layers to 2 or more and 23 or less is that if it were less than the lower limit, the boundary would not be introduced in the ferroelectric film 10 and the service life reliability cannot be further improved; and if it were more than upper limit, it would take too long for preparing the ferroelectric film. Preferably, the number of fired films is 2 layer or more and 6 layers or less. More preferably, it is 2 layers or more and 3 layers or less.

In laminating the fired films 10, when the first fired film and the second fired films are defined as each of a pair of adjacent fired films among the plurality of the fired films, they are laminated in such a way that the other surface (the surface on the side pith lower Li and the like concentration) of the first fired film is adjacent to the one surface (the surface on the side with higher Li and the like concentration) of the second fired film. Because of this, the content of Li and the like changes drastically in the fired film boundary.

It is preferable that the total content of Li and the like on the one surface (the surface on the side with higher and the like concentration) of the second fired film is five times or more of the total content of Li and the like on the other surface (the surface on the side with lower Li and the like concentration) of the first fired film. In terms of this drastic change of the total concentration of Li and the like in the boundary of the fired film, it is preferable that it is 5 times or more and 10 times or less. More preferably, it is 5 times or more and 9 times or less. However, the present invention is not particularly limited by these preferable ranges.

(4) Film Thickness of the Fired Film

In terms of the film thickness t of each of the fired films 101, it is preferable that it is 45 nm or more and 500 nm or less. If it were less than the lower limit, it would be harder to obtain the continuous film evenly; and if it were more than upper limit, cracking would be likely to occur. More preferably, the thickness t is 45 nm or more and 135 nm or less. Even more preferably, it is 60 nm or more and 120 nm or less. In terms of the thickness T of the ferroelectric film 10, it is preferable that it is 150 nm or more and 5000 nm or less. If it is less than the lower limit, it world become a film with poor productivity. In addition, problematic characteristics, such as a higher leakage current density and the like, are likely to occur occasionally. On the other hand, if it were more than the upper limit, cracking is like to occur occasionally. More preferably, the film thickness T of the ferroelectric film 10 is 200 nm or more and 4000 nm or less. Even more preferably, it is 250 nm or more and 3000 nm or less.

(5) Metal Atomic Ratio

It is preferable that in the ferroelectric film 10, the metal atomic ratio, Pb:La:Zr:Ti is (0.95-1.25):(0-0.05):(0.40-

0.55):(0.45-0.60). The reason for setting the metal atomic ratio is that it has a high specific permittivity and excellent characteristics as a ferroelectric can be obtained. More preferably, the metal atomic ratio Pb:La:Zr:Ti is (1.00-1.15):(0-0.03):(0.50-0.55):(0.45-0.50). Even more preferably, it is (1.05-1.10):(0.01-0.03):(0.51-0.53):(0.47-0.49).

(6) Substrate of the Ferroelectric Film and the Lower Electrode

As the substrate 12, upon which the ferroelectric film 10 is formed, heat resistant substrate such as the silicon substrate; the $SiO_2$/Si substrate; the sapphire substrate; and the like, are used, for example. As the lower electrode 11, materials, which have conductivity and do not react with the ferroelectric film 10, such as Pt, Ir, Ru, and the like are used, for example.

[Liquid Composition for Forming the Ferroelectric]

The liquid composition for forming the ferroelectric film (hereinafter referred as "the liquid composition") is the raw material solution for forming the ferroelectric film 10. The liquid composition is prepared by dissolving the precursor for constituting the metal oxide in the perovskite structure in the solvent in a required ratio; and adjusting the concentration suitable for coating.

(1) Total Content of Li and the Like

The liquid composition contains Li and the like at 3 mass ppm or more and 10 mass ppm or less as a total. Since the total content of Li and the like is 3 mass ppm or more, the ferroelectric film 10 having a sufficient concentration gradient can be obtained. In addition, since the total content of and the like is 10 mass ppm or less, the total concentration of Li and the like included in the obtained ferroelectric film 10 can be kept at a low level. More preferably, the total content of Li and the like in the liquid composition is 3 mass ppm or more and 5 mass ppm or less. The total content of Li and the like in the liquid composition can be adjusted by the method described in PTL 1, in which distillation; sublimation; and recrystallization of each metal element in a form of organic metal, are repeated, for example. Alternatively, the above-described method can be done using combined materials.

(2) Precursor

As the precursor blended in the liquid composition, the organic metallic compound, in which an organic group is bonded to each of metallic elements of Pb, La, Zr, and Ti through an oxygen atom or a nitrogen atom, can be used. For example, one or more selected from the group consisting of metal alkoxide, partial hydrolyzate of metal alkoxide; metal diol complex; metal triol complex; metal carboxylate; metal β-diketonate complex; metal β-diketoester complex; metal β-iminoketo complex; and metal amino complex, can be used. Particularly preferable composition is: metal alkoxide; partial hydrolyzate of metal alkoxide; and metal carboxylate.

These precursors are included in the liquid composition in a ratio resulting in the required metal atomic ratio.

For example, it is preferable that the ratio is set for obtaining the metal atomic ratio Pb:La:Zr:Ti of (0.95-1.25):(0-0.05):(0.40-0.55):(0.45-0.60). Because of this, the ferroelectric film 10 having a preferable metal atomic ratio as explained above can be obtained. More preferably, the metal atomic ratio Pb:La:Zr:Ti is (1.00-1.15):(0-0.03):(0.50-0.55):(0.45-0.50). Even more preferably, it is (1.05-1.10):(0.01-0.03):(0.51-0.53):(0.47-0.49).

A preferable ratio of the precursor in the 100 mass % of the quid composition is 10 mass % or more and 35 mass % or less in the corresponding value as oxide, if it were less than the lower limit, it would be harder to obtain a sufficient film thickness by single coating. If it were more than the upper limit, cracking would be likely to occur occasionally. More preferably, the ratio of the precursor is 10 mass % or more and 20 mass % or less. Even more preferably, it is 12 mass % or more and 17 mass % or less. The ratio in the corresponding value as oxide means the ratio of metal oxide in the 100% mass % of the liquid composition under assumption of the all metal elements included in the liquid composition being oxide.

(3) Solvent

The solvent used for preparing the liquid composition is determined appropriately based the material used. For example, any one of carboxylic acid, alcohol, ester, ketones, ethers, cycloalkanes, aromatics, tetrahydrofuran, and the like can be used. Alternatively, a mixed solvent including two or more of above-described solvents can be used.

(4) Polymer Compound

In addition, in order to adjust liquid viscosity, polymer compound such as polyvinylpyrrolidone (PVP), polyethylene glycol or the like can be included in the liquid composition. Preferably, the ratio of the polymer compound is in the range of 0.15 moles or more and 0.5 moles or less relative to 1 moles of the precursor in the corresponding value as a monomer. If it were less than the low limit, cracking would be likely to occur; and if it were more than the upper limit, pores would likely to be formed.

(5) Stabilizer

In addition, β-diketones, β-ketone acids, β-ketoesters, oxyacids, lower alkyl esters of the above-described oxy acid, oxyketones, diol, triol, higher carboxylic acid, alkanolamines, polyvalent amine, or the like may be added to the liquid composition to the extent as a stabilizer in the ratio of 0.2 or more and 3 or less in the ratio of (the number of molecules of the stabilizer)/(the number of atoms of the metal). Particularly, it is preferable that β-diketones and polyols are added. As β-diketones, it is preferable to add acetylacetone. As polyols, it is preferable to add propylene glycol

[Method of Producing the Liquid Compound]

In order to prepare the liquid composition, first, the above-described precursor is weighted to have the ratio resulting in the required metal atomic ratio. The precursor and the solvent are put in the reaction vessel to mix them. Preferably they are refluxed to react at a temperature of 150° C. or higher and 160° C. or tower for 30 minutes or more and 3 hours or less under nitrogen atmosphere. Then, the mixture is subjected to desolvation by the method such as distillation or evaporation. In the case where the stabilizer such as acetyl acetones is added, the stabilizer is added to the synthesized liquid after desolvation; and subjected to another reflux process in the same condition described above. Then, a solvent is added to dilute the mixture in order to adjust concentration of each of the components in the liquid composition to the above-described required concentrations. The polymer compound is added to obtain the required ratio as needed. Then, preferably, the mixture is stirred at a temperature near the room temperature for 30 minutes or more and 3 hours or less to be dispersed even. By following the above-described processes, the liquid composition is obtained.

[Method of Producing the Ferroelectric Film]

The above-described liquid composition, which contains Li and the like at 3 mass ppm or more and 10 mass ppm or less, is used; and the wind speed of a carrier gas is set to 0.1 m/sec or more and 1.0 m/sec or less at a position 10 mm above from an upper surface of the substrate in the step of calcining, in the method of producing a ferroelectric film of the present embodiment. Because of these, the ferroelectric film of the present embodiment, which contains Li and the like with a predetermined content and concentration gradient, can be obtained.

As the gas, air, steam, nitrogen gas containing steam, or the like can be used.

Figure 3:
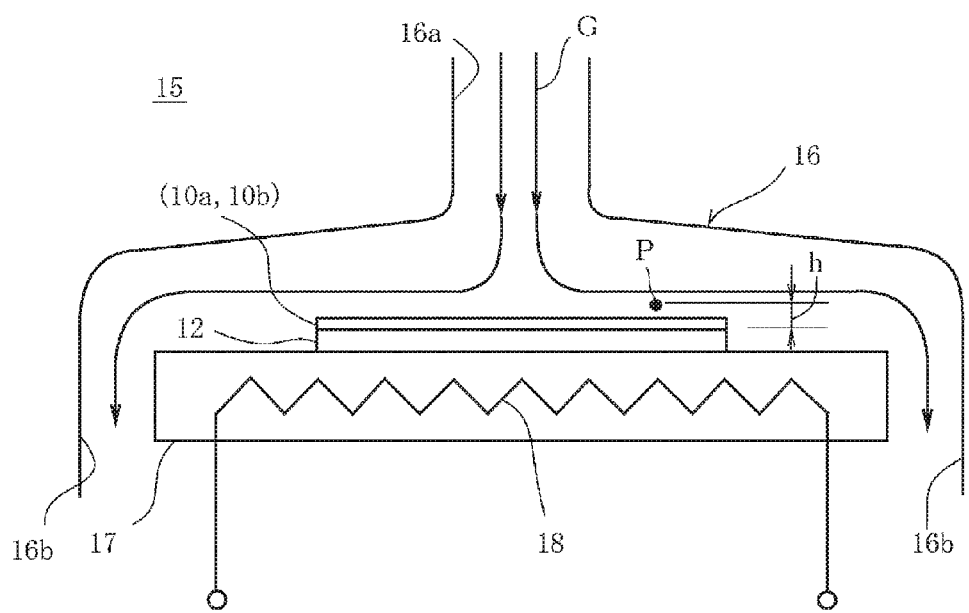
FIG. 3 is a cross-sectional view of the main part of the hot plate apparatus used in the step of calcining in an embodiment of the present invention.

The wind speed of the carrier gas means the wind speed in the direction parallel to the precursor film 10a in the outer most layer on the precursor film 10a in the outer most layer; and the speed of carrier gas at the point 10 mm above the upper surface of the substrate 12 (point P FIG. 3).

When the Li and the like contained in the liquid composition is less than 3 mass ppm, the fired film having a sufficient concentration gradient cannot be obtained. When it is more than 10 mass ppm, the total concentration of Li and the like included in the obtained ferroelectric film is excessively increased. Thus, having the total content of Li and the like in the liquid composition less than 3 mass ppm or more than 10 mass ppm is not preferable. In addition, when the wind speed of the carrier gas is less than 0.1 m/sec, vaporization of Li and the like during the heat treatment becomes insufficient; the total content of Li and the like resided in the film become excessive; and the fired film with appropriate concentration gradient cannot be obtained. When it is more than 1.0 m/sec, removal of the materials from the precursor becomes too fast; and cracks are formed in the obtained fired film. Therefore, having the wind speed of the carrier gas less than 0.1 m/sec or more than 1.0 m/sec is not preferable.

As shown in FIG. 3, in the method of producing the ferroelectric film 10 of the present embodiment, each of the steps of applying a liquid composition for fir forming the ferroelectric film containing Pb, Zr and Ti on a substrate 12 to form a precursor film 10a; calcining the precursor film 10a in order to convert thereof to complex oxide to form a calcined film 10b; and firing the calcined film 10b in order to crystallize thereof to form a fired film 101, is performed at least once. In the case where multiple layers of the fired films 101 are provided, the steps of applying, calcining; and firing are repeated as needed.

(1) Step of Applying

In the step of applying, the liquid composition is applied on the lower electrode 11 (refer FIG. 1) provided on the surface of the substrate 12 to form the precursor film 10a as shown in FIG. 3. In FIG. 3, the lower electrode not indicated. The application amount of the liquid composition at this time is set in such a way that the film thickness of the fired film 101 after firing becomes 45 nm or more and 500 nm or less as described above. In terms of the coating method, it is not particularly limited, but spin coating, dip coating, LSMCD (Liquid Source Misted Chemical Deposition), spin spraying, and the like are named.

(2) Step of Drying

After the step of applying, in order) remove low-boiling-point solvent and adsorbed water molecules, the step of drying, in which the precursor film 10a is heated, may be performed. The heating temperature differs for example depending on the kind of the solvent. However, normally it is 50° C. or more and 200° C. or less. More preferably, it is 65° C. or more and 75° C. or less. The step of drying can be omitted and the low-bailing-point solvent and the like can be removed in the step of calcining, since the low-boiling-point solvent and the like can be removed during raising temperature in heating in the next step of calcining.

(3) Step of Calcining

In the step of calcining, the precursor film 10a is heated to convert thereof to complex oxide, forming the calcined film 10b. The step of calcining and the above-described steps of drying are performed by using the hot plate apparatus 15 shown in FIG. 3, for example. The hot plate apparatus 15 has the chamber 16; the susceptor 17 with the horizontal upper surface; and the heater 18 embedded in the susceptor. In the upper middle part of the chamber, the supply port 16a for applying the carrier gas G into the hot plate apparatus is provided. On the both sides of the susceptor 17 below, exhaust ports 16b for exhausting the carrier gas G are provided. To the heater 18, the heater power supply, which is not depicted in the drawing, with a temperature controlling mechanism is connected. On the upper surface of the susceptor 17, the substrate with precursor film 10a is placed. In this hot plate apparatus 15, the carrier gas G introduced from the supply port 16a of the chamber 16 is directed toward the center of the substrate 11 first. Then, the carrier gas G flows along the upper surface of the substrate 11 and then exhausted from the exhausting port 16b provided to the lower part of the chamber 16. The wind speed of the carrier gum G can be controlled by adjusting the exhaust mechanism, which is not depicted in the drawing.

In the step of calcining, the substrate 12 is placed on the susceptor 17 and is heated while the carrier gas G flows in the hot plate apparatus 15. The wind speed of the carrier gas G at the point P at the height h, which is 10 mm above from the upper surface of the substrate 12, is set to 0.1 m/sec or more and 1.0 m/sec or less. The flow of the carrier gas G removes impurities including Li and the like in the precursor film 10a with the solvent, decomposed materials of the precursor film 10a, and the like. By setting the wind speed to 0.1 m/sec or more, the amount of impurities removed on the surface side of the precursor film 10a becomes more than the amount of impurities removed on the bottom surface side of the precursor film 10a. Accordingly, the fired film 101 having a sufficient concentration gradient can be obtained. In addition, by setting the wind speed to 1.0 m/sec or less, cracking on the fired film 101 due to too fast removal of the materials from the precursor film 10a can be prevented. More preferably, the wind speed is 0.4 m/sec or more and 0.6 m/sec or less. The reason for setting the measurement point of the wind speed at the height h, which is 10 mm above from the upper surface of the substrate 12, is to confirm the effect of the wind speed on the extent of removal of materials from the upper surface of the calcined film 10b accurately.

It is preferable to perform the step of calcining in the condition at 150° C. or more and 450° C. or less for 1 minute or more and 10 minutes or less, for example. More preferably, the calcining temperature is 200° C. or more and 400° C. or less. Even more preferably, it is 300° C. or more and 375° C. or less. In addition, it is preferable that the calcining time is 2 minutes or more and 5 minutes or less. The step of calcining is performed for removing the solvent; and converting the precursor into complex oxide by thermal decomposition hydrolysis. Thus, it is preferable that the step of calcining is performed in the air, oxidizing atmosphere, or atmosphere including steam. Accordingly, as the carrier gas G, air, stem, and nitrogen gas including steam can be utilized, for example. Each of the steps of the applying and calcining can be preformed once. However, in order to obtain the intended film thickness of the calcined film 10b, the next step of firing can be performed after repeating the steps of applying and calcining multiple times.

(4) Step of Firing

In the step of firing, the calcined film 10b is fired to be crystallized, forming the fired film 101. It is preferable that the step of firing is performed under the condition where the temperature is 600° C. or more and 800° C. or less for 1 minute or more and 5 minutes or less, for example. More preferably, the firing temperature is 650° C. or more and 750° C. or less. Firing can be performed by the rapid thermal annealing treatment (RTA treatment) by heating with an infrared lamp using RTA (Rapid Thermal Annealing) apparatus. When firing is performed by RTA treatment, it is preferable that the heating rate is 2.5° C./sec or more and 100° C./sec or less, for example. More preferably, it is 20° C./sec or more and 100° C./sec or less. Preferably, the firing atmosphere is oxygen, nitrogen, or mixture thereof, for example. By performing each of the above-described steps of applying, calcining, and firing at least twice, the ferroelectric film 10 made of multiple fired films 101 can be obtained.

[Electric Part]

The electric part of the present embodiment is the electric part for the thin film capacitor; the capacitor; IPD; DRAM memory capacitor; the multilayer capacitor; the gate insulator of the transistor; the non-volatile memory; the pyroelectric infrared detection element, the piezoelectric element; the electro-optical element; the actuator; resonator; the ultrasonic motor; the electrical switch; the optical switch; the composite electronic component of LC noise filter element; and the like, for example. The electric part of the present embodiment has the above-described ferroelectric film 10. Since these electric parts have the ferroelectric film 10, they have excellent service life reliability.

EXAMPLE

Next, Examples of the present invention are explained in detail with Comparative Examples.

Example 1

Reagent grade lead acetate trihydrate (Pb source); lanthanum acetate (La source); tetra-titanium isopropoxide (Ti source; tetra zirconium butoxide (Zr source) were highly purified by repeating recrystallization twice from the ultra-pure water by the method described in PTL 1; and the precursors were obtained. Each of the precursors was weighted to obtain the metal atomic ratio Pb/La/Zr/Ti of 110/3/52/48. Then, they were added to propylene glycol in the reaction vessel to prepare the synthetic liquid. After refluxing the synthetic liquid under a nitrogen atmosphere at 150° C. for 60 minutes, it is subjected to desolvation by distillation. Then, acetylacetone was added as the stabilizer, and the synthetic liquid was refluxed at 150° C. for 60 minutes.

Next, the synthetic liquid was diluted to 35 mass % of the total precursor concentration in the corresponding value as oxide by adding propylene glycol to the synthetic liquid. Furthermore, by adding ethanol, the synthetic liquid was diluted to 25 mass % of the total precursor concentration in the corresponding value as oxide. Next, polyvinylpyrrolidone (k value=30) was added to be 0.025 moles relative to 1 mole of the precursor; and the synthetic liquid was stirred at the room temperature for 24 hours to obtain the liquid composition for forming the ferroelectric film. When concentrations of Li, Na, and K were measured by using ICP (manufactured by ThermoFisher Scientific the total concentration was 10 mass ppm.

Next, the step of applying was performed. The liquid composition was dripped on the Pt/TiO$_2$/SiO$_2$/Si substrate set on the spin coater. Then, spin coating was performed at the rotational speed of 3000 rpm for 30 seconds to form the precursor film on the substrate. The above-described rotational speed and time of the spin coater were set in such a way that the film thickness of the fired film obtained in the single firing step became 90 nm.

Next, the step of calcining was performed. The substrate having the precursor film was placed on the susceptor of the hot plate apparatus; and retained at 300° C. for 5 minutes in the state where the carrier gas (dry was flowing in such a way that the wind speed at the height 10 mm above from the upper surface of the substrate is 1 m/sec. By performing the step of calcining, the precursor was converted into complex oxide to form the calcined film. The wind speed was measured by the hot-wire anemometer (Model: CW-60 manufactured by Custom Co.)

Next, the step of firing was performed. The temperature was raised to 700° C. at the heating of 30° C./sec by using RTA apparatus in the atmosphere in which oxygen gas was flowed at 2 L per a minute; and retained for 1 minutes. By performing the above-described step, the fired film with the film thickness of 90 nm was formed on the lower electrode of the substrate. By repeating the process from the step of applying to the step of firing three times, the ferroelectric film, which was made of 3 layers of the fired films 101 and had the film thickness of 270 nm, was obtained. The film thickness was measured by the scanning electron microscope (Model s4300 manufactured by Hitachi Co.). When the metal atomic ratio Pb:La:Zr:Ti of the ferroelectric film was measured by using ICP (manufactured by ThermoFisher Scientific Co.), it was 103/3/52/48.

Examples 2-9, Comparative Examples 1-4

The ferroelectric films were formed as in Example 1, except for the changes of each of conditions as described in Table 1. Specifically the film thickness of the fired films was changed by adjusting the rotation speed and time of the spin coater in some of Examples. In addition, the repeat count of the steps (number of times of firing) and the film thickness of the ferroelectric films were changed in some of Examples. The liquid compositions having different concentrations of Li and the like were used in some of Examples and Comparative Examples by changing the number of times of recrystallization for high purification. The wild speed was changed in some of Comparative Examples. The metal atomic ratio Pb/La/Zr/Ti of the precursor was 110/0/52/48 in Example 9.

[Evaluation]

By using the ferroelectric films formed in Examples and Comparative Examples, the total concentration of Li and the like and the concentration gradient in the film; and service life reliability were evaluated by the methods described below.

(1) The Total Concentration of Li and the Like

The total concentration of Li and the like was measured by using ICP (manufactured by ThermoFisher Scientific co).

(2) Concentration Gradient of Li and the Like

In order to obtain the concentration gradient of Li and the like, concentration distribution of Li and the like in the film thickness direction shown in FIG. 2 was measured by using ABS (manufacture by Ulvac Co.). The concentration gradient was obtained by dividing the concentration of Li and the like on one surface of each of fired film by the concentration of Li and the like on other surface. The average values of the concentration gradient of all fired films were shown in Table 1.

(3) Service Life Reliability

The evaluation of the service life reliability was performed by the acceleration test (HALT: highly-accelerated life testing), in which samples were subjected to the environment with a higher load (high temperature, high voltage) than the normal usage condition. The evacuation samples were obtained by depositing a platinum film in a dotted form (area: $3.5 \times 10^{-2}$ mm$^2$) on each of ferroelectric films of Examples and Comparative Examples by the sputtering method; forming the upper Pt electrode to form multiple capacitor structures on the same substrate; and then heating at 700° C. for 1 minute under the oxygen atmosphere.

The upper Pt electrode and the lower P electrode of the thin film capacitor were electrically connected; and the voltage of 10-20 V was applied in the condition where the thin film capacitor was heated to 125° C. to 205° C. Then, the voltage applying time and the leakage current value flowing in each of capacitors were measured. As time was passed, the dielectric breakdown due to capacitor deterioration occurred, and sudden increase of the leakage current was confirmed. Thus, based on the measured date, the time for each capacitor to reach to the dielectric breakdown was recorded (TDDB (time-dependent dielectric breakdown evaluation)). Specifically, it was regarded the dielectric breakdown occurred at the point where the leakage current value exceeded 100 μA. Then, statistical processing by Weibull distribution analysis was performed to multiple data of the dielectric breakdown time, and the time when 63.2% of the all capacitors were in the dielectric breakdown was defined as the mean time to failure (MTF). In terms of the bulk capacitors, the empirical formula (1) below is known.

[Formula 1]

$$\frac{t_1}{t_2} = \left(\frac{V_1}{V_2}\right)^{-N} \exp\left[\frac{E_a}{k_B}\left(\frac{1}{T_1} - \frac{1}{T_2}\right)\right] \quad (1)$$

In the formula (1) t, T, v, $E_a$, N, and $K_B$ are MTF, the testing temperature, the applied DC voltage, the activation energy, the voltage acceleration coefficient, and the Boltzmann constant, respectively. In addition, the suffixes "1" and "2" indicate arbitrary conditions of temperature or applied voltage. From the above-described formula (1), it is understood that the temperature T and the applied voltage V effect on the service life of the capacitor. This time, the above-described equation was used for the thin capacitor. Assuming the voltages V are constant ($V_1=V_2$) in the formula (1), the formula (2) shown below is obtained.

[Formula 2]

$$\frac{t_1}{t_2} = \exp\left[\frac{E_a}{k_B}\left(\frac{1}{T_1} - \frac{1}{T_2}\right)\right] \Rightarrow \ln t = K_V + \frac{E_a}{k_B T} \quad (2)$$

In the formula (2), $K_v$ is a constant depending on the temperature. The inverse of the temperature and the logarithmic expression UNITE have a liner relationship. By using this, the activation energy $E_a$, which is the acceleration factor to the temperature, can be estimated. In the same manner, assuming the temperatures T are constant ($T_1=T_2$) in the formula (1), the formula (3) can be obtained.

[Formula 3]

$$\frac{t_1}{t_2} = \left(\frac{V_1}{V_2}\right)^{-N} \Rightarrow \ln t = K_T - N \ln V \quad (3)$$

In the formula (3), KT is a constant depending on the applied voltage. The voltage acceleration coefficient N, which is the acceleration factor to the voltage, can be estimated. By using values of these two acceleration factors Ea and N, MTFs in the condition where the sample was heated to 85° C. and was applied 5V voltage were extrapolated; and estimated the values as the service life expectancy. Obtained results are shown in the next Table 1.

TABLE 1

|  | Film thickness of the ferroelectric film (nm) | Film thickness of each fired film (nm) | Number of times of firing (times) | The total concentration of Li, Na, and K in the liquid composition (mass ppm) | Wind speed in the step of calcining (m/sec) | Li, Na, and K in the film | | Service life reliability Service life expectancy (years) | Presence or absence of cracking |
|  |  |  |  |  |  | The total concentration (mass ppm) | Concentration gradient (times) |  |  |
|---|---|---|---|---|---|---|---|---|---|
| Ex. 1 | 270 | 90 | 3 | 10 | 1 | 1.1 | 6 | 57 | Absent |
| Ex. 2 | 270 | 90 | 3 | 10 | 0.5 | 1.8 | 8 | 66 | Absent |
| Ex. 3 | 270 | 90 | 3 | 10 | 0.1 | 3 | 12 | 51 | Absent |
| Ex. 4 | 450 | 90 | 5 | 10 | 0.5 | 1.7 | 9 | 88 | Absent |
| Ex. 5 | 1000 | 100 | 10 | 10 | 0.5 | 2 | 7 | 123 | Absent |
| Ex. 6 | 2000 | 100 | 20 | 10 | 0.5 | 2.1 | 7 | 160 | Absent |
| Ex. 7 | 3000 | 100 | 30 | 10 | 0.5 | 1.9 | 8 | 197 | Absent |
| Ex. 8 | 270 | 90 | 3 | 6 | 0.5 | 1.5 | 6 | 58 | Absent |
| Ex. 9 | 270 | 90 | 3 | 3 | 0.5 | 1.1 | 5 | 35 | Absent |
| C. Ex. 1 | 270 | 90 | 3 | 0.8 | 0.5 | 0.3 | 1 | 18 | Absent |
| C. Ex. 2 | 270 | 90 | 3 | 10 | 0 | 6.1 | 20 | 11 | Absent |
| C. Ex. 3 | 270 | 90 | 3 | 10 | 1.5 | 0.7 | 3 | 0 | Present |
| C. Ex. 4 | 270 | 90 | 3 | 30 | 0.5 | 5.6 | 7 | 22 | Absent |

From Table 1, it is understood that the ferroelectric films of Examples (Ex.) of the present invention, which were formed in the scope of the production method of the present invention and had the total concentration of Li and the like and the concentration gradient in the predetermined ranges, had long service life expectancies and excellent service life reliabilities. In the ferroelectric film of Comparative Example (C. Ex.) 1, in which the liquid composition with a lower total concentration of Li and the like was used, the concentration gradient was moderate and the service life expectancy was shorter than those of Examples of the present invention. In the ferroelectric film of Comparative Example 2, in which the wild speed in the step of calcining was set in a smaller value, the total concentration of Li and the like was too high, the concentration gradient was steep, and the service life expectancy was shorter than those of Examples of the present invention. In the ferroelectric film of Comparative Example 3, in which the wind speed in the step of calcining was set to a larger value, visually detectable cracks were formed. In the ferroelectric film of Comparative Example 4, in which the liquid composition with a higher total concentration of Li and the like was used, the total concentration of Li and the like was too high, and the service life expectancy was shorter than those of Examples of the present invention.

INDUSTRIAL APPLICABILITY

The ferroelectric film of the present invention can be utilized to the electric part of: the thin film capacitor; the capacitor; IPD; DRAM memory capacitor; the multilayer capacitor; the gate insulator of the transistor; the non-volatile memory; the pyroelectric infrared detection element, the piezoelectric element; the electro-optical element; the actuator; resonator; the ultrasonic motor; the electrical switch; the optical switch; the composite electronic component of LC noise filter element; and the like.

The invention claimed is:

1. A ferroelectric film made of a plurality of fired films, wherein
    each of the plurality of fired films is made of metal oxide in a perovskite structure including Pb, Zr, and Ti,
    a total content of Li, Na, and K in each of the plurality of fired films is 0.3 mass ppm or more and 3 mass ppm or less, and
    the total content of Li, Na, and K is different on two surfaces of each of the plurality of fired films, the total content of Li, Na, and K on one surface of each of the plurality of fired films is 5 times or more of the total content of Li, Na, and K on the other surface of each of the plurality of fired films.

2. The ferroelectric film according to claim 1, wherein a constant concentration gradient of the total content of Li, Na, and K is formed in a film thickness direction between the one surface and the other surface in each of the plurality of fired films.

3. The ferroelectric film according to claim 2, wherein the other surface of a first fired film is adjacent to the one surface of a second fired film, the first fired film and the second fired film being each of a pair of adjacent fired films among the plurality of the fired films.

4. The ferroelectric film according to claim 3, wherein the total content of Li, Na and K on the one surface of the second fired film is 5 times or more of the total content of Li, Na, and K on the other surface of the first fired film.

5. The ferroelectric film according to claim 1, wherein the total content of Li, Na, and K in each of the plurality of fired films is 0.5 mass ppm or more.

6. The ferroelectric film according to claim 1, wherein the total content of Li, Na, and K in each of the plurality of fired films is 1 mass ppm or more.

7. An electric part including the ferroelectric film according to claim 1.

8. A method of producing the ferroelectric film according claim 1 comprising the steps of:
    applying a liquid composition for forming the ferroelectric film containing Pb, Zr and Ti on a substrate to form a precursor film at least once;
    calcining the precursor film in order to convert thereof to complex oxide to form a calcined film at least once; and
    firing the calcined film in order to crystallize thereof to form a fired film at least once, wherein
    the liquid composition for forming the ferroelectric film contains 3 mass % or more and 10 mass % or less of Li, Na and K as a total, and
    a wind speed of a carrier gas is 0.1 m/sec or more and 1.0 m/sec or less at a position 10 mm above from an upper surface of the substrate in the step of calcining.

* * * * *